United States Patent [19]

Cline et al.

[11] 3,972,742

[45] *Aug. 3, 1976

[54] DEEP POWER DIODE

[75] Inventors: Harvey E. Cline; Thomas R. Anthony, both of Schenectady, N.Y.

[73] Assignee: General Electric Company, Schenectady, N.Y.

[ * ] Notice: The portion of the term of this patent subsequent to May 11, 1993, has been disclaimed.

[22] Filed: Nov. 22, 1974

[21] Appl. No.: 526,145

Related U.S. Application Data

[62] Division of Ser. No. 411,011, Oct. 30, 1973.

[52] U.S. Cl. ............................ 148/1.5; 148/171; 148/172; 148/177; 148/179; 252/62.3 GA; 252/62.3 E; 252/62.3 ZT
[51] Int. Cl.² ............................................ H01L 7/42
[58] Field of Search ............ 148/171, 172, 173, 1.5, 148/177, 179; 75/65 ZM; 252/62.3 GA, 62.3 E, 62.3 ZT

[56] References Cited
UNITED STATES PATENTS

| | | | |
|---|---|---|---|
| 2,813,048 | 11/1957 | Pfann | 148/1.5 UX |
| 3,484,302 | 12/1969 | Maeda et al. | 148/1.5 |
| 3,520,735 | 7/1970 | Kurata | 148/1.5 |

OTHER PUBLICATIONS

R.C.A. Review, Dec. 1963, pp. 528–533.

*Primary Examiner*—G. Ozaki
*Attorney, Agent, or Firm*—Donald M. Winegar; Joseph T. Cohen; Jerome C. Squillaro

[57] ABSTRACT

A semiconductor diode comprises a first body of semiconductor material having a selected resistivity and a first type conductivity and a region of second type conductivity and a selected resistivity. The second body consists of recrystallized semiconductor material or a layer thereof having solid solubility of a dopant therein and has the same crystallographic structure as the first body. The second region is formed by a temperature gradient zone melting process embodying the migration of a metal-enriched melt of semiconductor material through the second body of semiconductor material which initially has a <111> axial crystallographic orientation.

9 Claims, 10 Drawing Figures

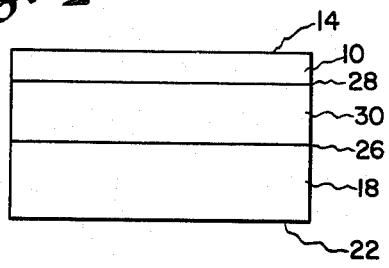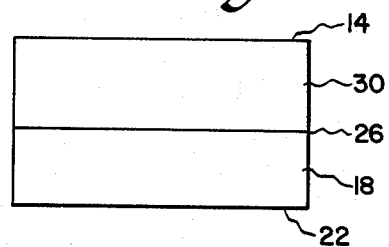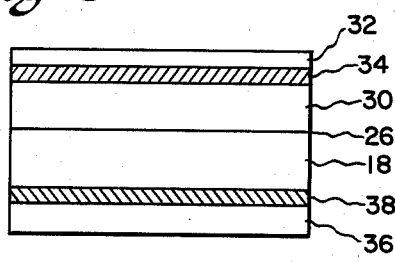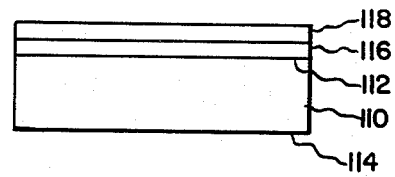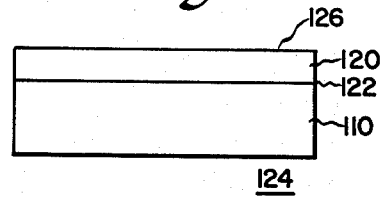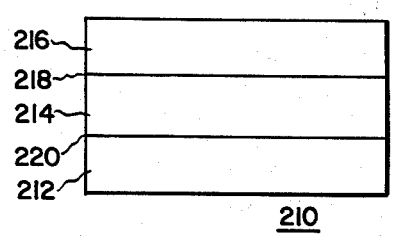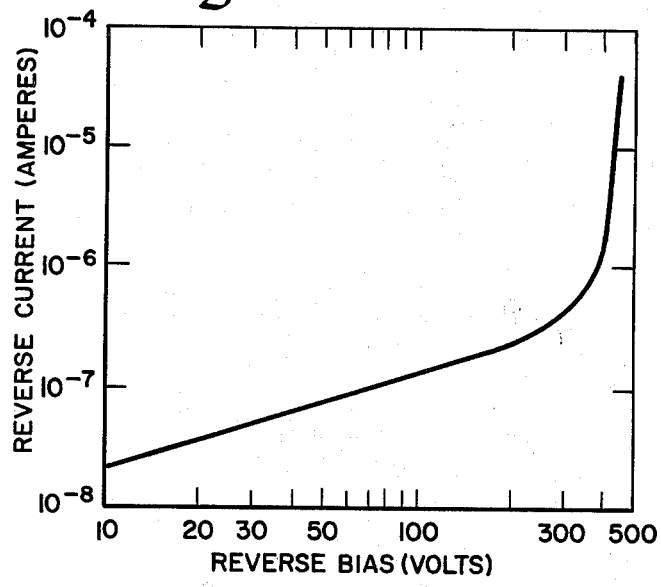

DEEP POWER DIODE

This is a division, of application Ser. No. 411,011, filed Oct. 30, 1973.

BACKGROUND OF THE INVENTION

1. Field of the Invention

This invention relates to semiconductor power diodes and a temperature gradient zone melting process for making the same.

2. Description of the Prior Art

Heretofore, semiconductor diodes have been made by diffusion, alloying or epitaxial growth techniques. All such processes involve procedures wherein the optimum physical characteristics of the diodes are never achieved. Procedures are such that the introduction of contaminants inherent with the process techniques practiced degrade the physical characteristics of the diodes manufactured.

An object of this invention is to provide a new and improved semiconductor power diode, the structure of which overcomes the deficiencies of the prior art.

Another object of this invention is to provide a new and improved semiconductor power diode which has maximum theoretical breakdown voltage as determined by the materials embodied therein.

Another object of this invention is to provide a new and improved semiconductor power diode which has a sharper P-N junction profile than any P-N junctions in prior art diodes.

A further object of this invention is to provide a new and improved semiconductor power diode which has a faster recovery time and better switching characteristics than the prior art power diode devices.

A still further object of this invention is to provide a temperature gradient zone melting process to make a new and improved semiconductor power diode.

Other objects of this invention will, in part, be obvious and will, in part, appear hereinafter.

BRIEF DESCRIPTION OF THE INVENTION

In accordance with the teachings of this invention, there is provided a semiconductor diode comprising a body of single crystal semiconductor material having two major opposed surfaces substantially parallel to each other. The body has a selected resistivity, a first type conductivity and a preferred crystallographic structure. A region of second and opposite type conductivity is formed in the body and has a surface area comprising one of the two major opposed surfaces of the body. The region has a substantially uniform resistivity throughout and comprises recrystallized material of a second body of semiconductor material having initially a <111> crystallographic structure having solid solubility of material therein. The region of recrystallized material has a sufficient impurity concentration of a suitable dopant material to impart a second and opposite type conductivity to the region. A P-N junction is formed by the contiguous surfaces of the region and the remaining semiconductor material of the body. The P-N junction is well defined, has a narrow width and is a step P-N junction.

Temperature gradient zone melting is utilized to make the power diode of this invention. A layer of metal which is or includes a dopant material is vapor deposited on a body of semiconductor material. The material is one selected from the group consisting of silicon, silicon carbide, gallium arsenide, germanium and the group III-V and II-VI semiconductor compounds, having a <111> crystallographic orientation. The metal layer is migrated through the semiconductor material to form the region. An alternate temperature gradient zone melting process embodies disposing a metal layer comprising the dopant material on a surface of a body of semiconductor material. A layer of semiconductor material is then deposited on the metal layer. The metal layer is migrated through the deposited layer of semiconductor material by temperature gradient zone melting to form the basic power diode structure.

DESCRIPTION OF THE DRAWINGS

FIGS. 4, 5 and 6 are elevation views, in cross-section, of the bodies of semiconductor material of FIGS. 1 and 2 being processed further in accordance with the teachings of this invention;

FIG. 7 is a graph of reverse current in amperes vs. reverse bias in volts of a semiconductor power diode made in accordance with the teachings of this invention;

FIGS. 8 and 9 are elevation views of a body of semiconductor material being processed by an alternate process in accordance with the teachings of this invention, and FIG. 10 is an elevation view, in cross-section, of another semiconductor device embodying the process of this invention.

DESCRIPTION OF THE INVENTION

Figure 1:
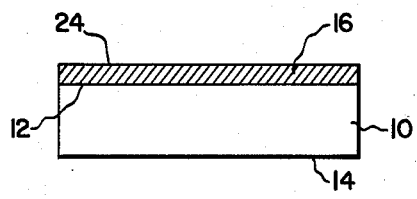
FIGS. 1 and 2 are elevation views, in cross-section, of bodies of semiconductor material being processed in accordance with the teachings of this invention.

Referring now to FIG. 1, there is shown a first body 10 of single crystal semiconductor material having a first type conductivity and a preferred resistivity. The body 10 has a top surface 12 and a bottom surface 14 which are two major surfaces substantially parallel to each other. The resistivity of the material comprising the body 10 varies with the requirement for the desired breakdown voltage of the device to be built. The body 10 has a preferred planar (111) crystallographic structure for its surfaces 12 and 14. This preferred (111) planar crystallographic structure of the surfaces is required to enable the metal to maintain a substantially uniform front which advances forward through the body 10 during a temperature gradient zone melting process employed in this invention. Suitable materials for comprising the body 10 are silicon, silicon carbide, gallium arsenide and germanium. In order to describe the invention more fully, the body 10 will be described as being of silicon semiconductor material.

The body 10 of silicon is prepared in the customary way of all semiconductor materials for metal vapor deposition by such suitable process means as grinding, polishing, lapping, and chemical polishing to remove damaged layers of semiconductor material. The process of preparing the body 10, including the aforementioned process steps, which are not shown, is not described in detail for such processing and treatment of the body 10 is well known in the art and is not pertinent to the invention herein.

A layer 16 of a suitable metal is deposited on the top surface 12 of the body 10. The material of the metal layer 16 is one that will suitably dope the material of the body 10 to produce a second and opposite type conductivity in the body 10. In order to describe the invention more particularly, the body 10 is said to be of N-type conductivity. The layer 16 will then be of a suitable material such, for example, as aluminum, to produce the second, and opposite type conductivity, P-type conductivity, in the body 10. The layer 16 of aluminum is deposited by any suitable means known to those skilled in the art such, for example, vacuum deposition, electron beam deposition and the like which will produce a substantially oxygen-free deposit of metal for the temperature gradient zone melting process to be practiced.

Figure 2:
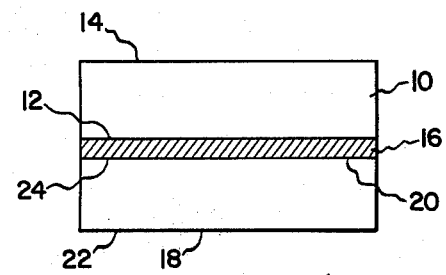

With reference to FIG. 2, a second body 18 of silicon single crystal semiconductor material of N-type conductivity and a selected resistivity is prepared in the same manner as the first body 10. The second body 18 has a top surface 20 and a bottom surface 22 which are two major surfaces substantially parallel to each other. The second body 18 of silicon may have any of the crystallographic structures which are inherent of silicon material. Preferably, however, to avoid confusion in making a large area power diode, the second body 18 of silicon also has a (111) planar crystallographic structure for the surfaces 20 and 22. It is to be noted that body 18 is preferably of the same material as the body 10.

A sandwich of the two processed silicon bodies 10 and 18 is prepared. The first body 10 is disposed on the second body 18 and so oriented that the exposed major surface 24 of the layer 16 of aluminum is disposed on, and in physical contact with the top surface 20 of the second body 18 of silicon.

The prepared sandwich is placed in apparatus suitable for producing a thermal gradient substantially coinciding with the vertical axis of the bodies 10 and 18 between the two surfaces 14 and 22. The thermal gradient is therefore substantially aligned with the <111> axis of the body 10. The bottom surface 14 of the first body 10 of silicon is oriented so as to be exposed to a source of thermal energy wherein the temperature is higher than that to which the bottom surface 22 of the body 18 of silicon is exposed. A temperature gradient zone melting (TGZM) process is practiced to produce a large area power diode. A temperature gradient of from 10°C per centimeter to 200°C centimeter is maintained in the bulk of silicon material during the migration of the later 16 of aluminum through the body 10. Preferably, the temperature gradient is maintained at a calculated temperature gradient of 100°C/cm in the bulk of silicon comprising the sandwich. The calculated temperature gradient $\nabla T_s$ is derived from the equation $$K_s \nabla T_s = E \delta T_c^4$$

where $K_s$ is the thermal conductivity of the semiconductor material-silicon

E is the emissivity of the semiconductor material-silicon $\delta$ is the Stefan-Boltzman Radiation constant.

$T_c$ is the temperature of the cold face of the body of semiconductor material-silicon.

$T_s$ is the temperature gradient in the body of the semiconductor material.

The temperature gradient zone melting (TGZM) process may be carried out at a pressure ranging from approximately $1 \times 10^{-7}$ torr to approximately $1 \times 10^{-5}$ torr. Preferably the TGZM process is practiced at a pressure of less than $1 \times 10^{-5}$ torr.

Figure 3:
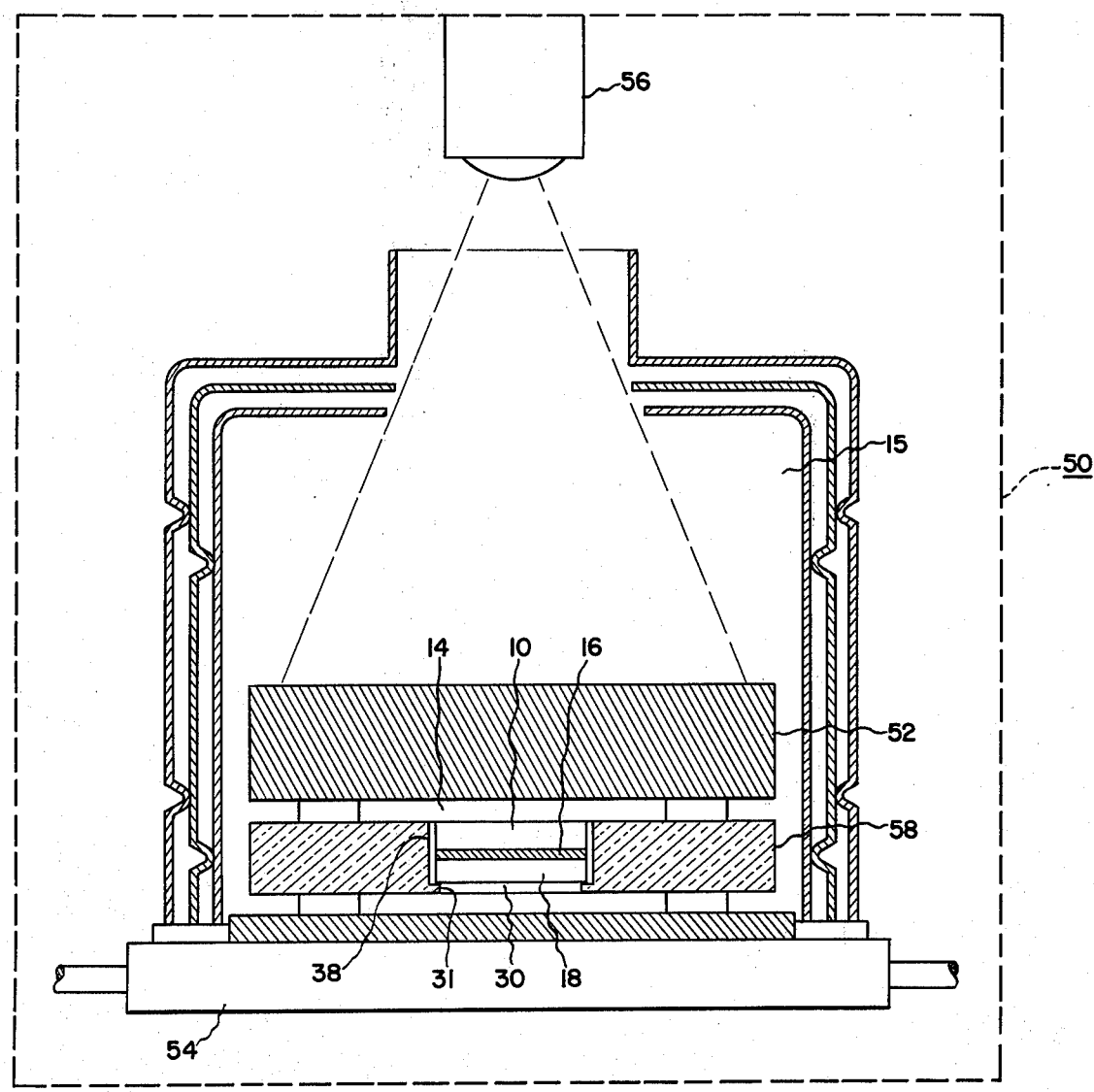
FIG. 3 is an elevation view, partly in cross-section, of apparatus suitable for practicing the process of this invention.

A schematic of a suitable vacuum furnace apparatus 50 for the temperature gradient zone melting process of this invention is shown in FIG. 3. The processed sandwich of FIG. 2 is disposed between a hot source 52 and a cold source 54. The hot source may, for example, be a block of molybdenum suitably heated by a source 56 of thermal energy such, for example, as an electron beam. It is essential that the hot source 52 uniformly heat the bottom surface 14 of the body 10 to a temperature of from 700°C to 1400°C to achieve the range of calculated temperature gradient of from 50°C per centimeter to 200°C per centimeter. The cold source 54 may, for example, be a water cooled copper block. When the cold source 54 is a water cooled block maintained at from 25°C to 50°C and the top surface 14 of the body 10 is uniformly heated to 1000°C ± 20°C the calculated temperature gradient is 100°C per centimeter for the bulk of silicon material through which the aluminum layer 14 is to be migrated. Radiation shields 58 are provided about the processed sandwich and the hot and cold sources 52 and 54 respectively to prevent excessive loss of heat or possible influence on the thermal gradient in the bodies 10 and 18 during the TGZM process. In particular, the radiation shields prevent thermal energy from being transported to or from the sides of the sandwich.

Referring now to FIGS. 3 and 4 initially, upon being heated to the operating temperature for the temperature gradient zone melting process, the layer 16 of aluminum becomes molten and alloys with the immediately adjacent silicon material of the top surfaces 12 and 20 of the respective bodies 10 and 18 to produce a continuous molten interface of aluminum-rich silicon. The molten interface continues to increase in size until a pool of aluminum-rich silicon liquid is formed between the two bodies 10 and 18. As a result of the temperature gradient, the pool of aluminum-rich silicon liquid begins to migrate up through the body 10 from the top surface 12 thereof towards the bottom surface 14. Aluminum-doped recrystallized silicon of the body 10 and that of the top surface 20 of the body 18 is deposited beginning at the interface of the layer 16 and the body 18 thereby creating a P-N junction 26. The migration of the aluminum-rich silicon liquid upward through the body 10 is accomplished by establishing and maintaining the aforementioned finite thermal gradient in a first direction substantially parallel to the vertical axis of the sandwich. Coextensively in time, a second or zero temperature gradient is established and maintained in the sandwich in a second direction which is normal to the first direction through the assistance of the radiation shields 58 of the apparatus 50. The interface 28 between the aluminum-rich silicon liquid and the silicon of the body 10 is a large liquid area in the silicon body having a (111) planar crystallographic structure and a <111> migration direction and migrates as a substantially continuous planar surface. Examination of the front as it migrates up through the body reveals it to be continuous throughout its expanse. As long as the thermal gradient is maintained, the molten pool of aluminum-rich silicon continues to migrate upward through the body 10 continually creating a new molten zone of aluminum and silicon at its front interface and depositing an aluminum doped recrystallized silicon region 30 of ever increasing size. The recrystallized region 30 has a solid solubility of the dopant impurity. Because the temperature gradient across the thickness of the body 10 is small, and the slope of the solid solubility curve for aluminum in silicon is small in the temperature range in which the temperature gradient zone melting is practiced, the dopant concentration and the resistivity throughout the recrystallized region 30 is substantially constant. That is, the impurity concentration of aluminum in the silicon of the region 30 is approximately $2 \times 10^{19}$ atoms per cubic centimeter.

In silicon having crystallographic structure orientation other than <111>, the molten interface 28 of the migrating aluminum-silicon melt is very irregular. If the deviation from the <111> growth axis be too great, the migrating interface 28 breaks up and results in a highly irregular P-N junction in the body 10 and a power diode of undesirable electrical characteristics. However, when the thermomigration is maintained substantially along the <111> axis, the temperature gradient zone melting process continues with a substantially uniform molten interface 28 until all of the body 10 is converted to an aluminum-doped region 30 of recrystallized silicon material of the body 10. The excess aluminum is removed from the surface 14 upon completion of the process. The completed power diode structure is illustrated in FIG. 5.

For a more detailed description of the process and the apparatus employed in the migration of selected dopant materials through a body of semiconductor material, including for example, the migration of aluminum in silicon, one is directed to our following copending patent applications filed on the same day as this patent application and assigned to the same assignee as our present application: Method of Making Deep Diode Devices, U.S. Pat. No. 3,901,736; Deep Diode Device Production and Method, Ser. No. 411,021; Deep Diode Devices and Method and Apparatus, Ser. No. (RD-6506) and now abandoned in favor of Ser. No. 552,154; High Velocity Thermomigration Method of Making Deep Diodes, U.S. Pat. No. 3,898,106; Deep Diode Device Having Dislocation-Free P-N Junctions and Method, U.S. Pat. No. 3,902,925; and The Stabilized Droplet Method of Making Deep Diodes Having Uniform Electrical Properties, U.S. Pat. No. 3,899,361.

Referring now to FIG. 6, a first electrical contact 32 is affixed to the region 30 by a suitable ohmic solder layer 34. The diode is completed by affixing a second electrical contact 36 to the body 18 by a suitable layer 38 of ohmic solder material.

Large area power diodes prepared in the manner heretofore described achieve excellent electrical characteristics without the necessity of providing passivating coatings on exposed surfaces of the devices, including the exposed surfaces of the P-N junction. The resulting P-N junction upon completion of processing are clean and very definitive. An abrupt, step P-N junction is present. The breakdown voltage of diodes made in accordance with the teachings of this invention achieves substantially the theoretical breakdown voltage which is obtainable for the semiconductor material of the bodies 10 and 18 employed and the dopant material comprising the layer 16. The leakage current of the prepared diode devices is excellent when compared to prior art devices.

The following examples are illustrative of the teachings of this invention:

EXAMPLE I

Two wafers of silicon single crystal series conductor material, each being one centimeter in thickness, were cut from a rod one inch in diameter. The silicon material of the rod was of N-type conductivity being phosphorus doped and being of 10 ohm-centimeter resistivity, 50 microsecond lifetime, <111> crystallographic orientation with $1 \times 10^3$ dislocations per square centimeter. Each wafer was prepared in the usual manner of polishing and lapping for semiconductor process work. A layer of aluminum metal 50 microns in thickness was deposited on one major surface of (111) planar orientation of one wafer by electron beam vapor deposition. The purity of the aluminum metal was 99.9999%. Deposition of the aluminum was practiced at a pressure of $1 \times 10^{-5}$ torr and required 50 minutes to deposit the layer of aluminum. No special preparation was practiced to protect the sides and other major surface of the wafer since they were shielded by the type of apparatus employed.

The two wafers were then disposed relative to each other as shown in FIG. 2 to form the workpiece "sandwich". The sandwich was disposed in apparatus suitable for practicing thermal gradient zone melting. The heat source was a molybdenum disk heated by an electron beam apparatus. The cold source, or heat sink, was a water-cooled copper disk. A calculated temperature gradient of 100°C per centimeter was established in the silicon material of the semiconductor sandwich substantially aligned with the <111> axis of the wafers by heating the molybdenum disk to a temperature sufficient to heat the major surface of the wafer closest to the molybdenum disk to 1090°C ± 20°C and maintaining it thereat. The temperature of the water cooled copper disk was maintained at 25°C ± 5°C. The process was practiced at a pressure of $1 \times 10^{-5}$ torr for two hours. The aluminum layer was not migrated entirely through the body of silicon.

Upon completion of the process, the sandwich was removed, sectioned, and examined in infrared transmission. The two wafers had been physically joined together. The P-N junction produced by the thermal gradient zone melting process had an extremely sharp junction profile. The aluminum-silicon migration had progressed a distance of 3 millimeters into the wafer upon a surface of which the aluminum had been deposited.

A sample diode 6.8 millimeters × 15 millimeters was cut from the processed sandwich and subjected to electrical testing. The P-N junction area was calculated to be 5 square millimeters. The breakdown voltage of the sample diode was 400 volts. This is the theoretical voltage which can be achieved for 10 ohm-centimeter N-type silicon doped with aluminum wherein the impurity concentration therein is approximately $2 \times 10^{19}$ atoms per cubic centimeter. The current leakage at 10 volts was $3 \times 10^{-8}$ amperes. At 100 volts, the current leakage was $1 \times 10^{-7}$ amperes. The width of the P-N junction was determined by capacitance versus voltage measurements. The P-N junction profile of the P-N junction formed by the initial aluminum layer and the uncoated silicon wafer was one-third of a micron in width. Very little diffusion of aluminum into silicon across the P-N junction had occurred during the process. The lifetime of the processed body "sandwich"

material was one microsecond. This process was carried on under non-clean room conditions.

A graph of the reverse current in amperes versus the reverse bias in volts of a sample having a 3 square millimeter P-N junction area of the above sample is shown in FIG. 7.

The diode as prepared has excellent electrical characteristics for both the breakdown voltage and the current leakage requirements. As noted, these achievements were obtained without any special surface passivation means being employed for the processed example and without employing clean room conditions.

EXAMPLE II

The process of Example I was repeated except that the material of each of the wafers had a <100> crystallographic orientation. The established thermal gradient was substantially aligned with the <100> axis of the wafers.

Examination of the P-N junction formed by the migrating interface showed the interface to be highly irregular in shape. Such a device is unreliable for a large area high power diode device. However, low power diodes can be manufactured from the processed "sandwich" by trimming back the sandwich to remove the irregular interface.

Large area power diodes prepared by the process of this invention exhibit extremely sharp junction profiles. That is, a step P-N junction is obtained. Very little diffusion of the aluminum into the silicon from across the P-N junction occurs in the process of this invention. The width of the P-N junction is approximately one-third micron for a process temperature range of from 700°C to approximately 1000°C. The lifetime of large area power diodes of this invention when prepared under clean room conditions are superior to the lifetime of prior art devices.

An alternate method of making a high power diode embodies primarily vapor deposition techniques for both the semiconductor material and its dopant material. Referring now to FIG. 8, a body 110 of semiconductor material is prepared by suitable means such, for example, as by lapping and polishing for vapor deposition of metal thereon. The body 110 has a top surface 112 and a bottom surface 114. The material of the body 110 may be silicon, germanium, silicon carbide, gallium arsenide, a compound of a Group II element and a Group VI element and a compound of a Group III element and a Group V element. In order to describe the invention more specifically, the body 112 will be described as being of silicon semiconductor material having N-type conductivity.

A layer 116 of metal is deposited on the surface 112 by such suitable means, as by vapor deposition, electron beam, and the like, wherein the layer of metal deposited will be substantially oxygen free. The material of the layer 116 is one that will easily wet the surfaces of the semiconductor material that it comes in contact with during the initial period of heating of the thermal gradient zone melting process. In addition, the material of the layer 116 is suitable for doping semiconductor material with an impurity material suitable for producing a desired P-type or N-type conductivity. A suitable material for comprising the layer 116 is aluminum when the body 110 is silicon of N-type conductivity.

A layer 118 of semiconductor material is deposited on the layer 116 of metal. The semiconductor material may be the same as that of, or be any of the other materials suitable for comprising, the body 110. The material of the layer 118 may be deposited by any suitable means such, for example, as by vapor phase deposition or by depositing the material in powder form on the surface of the layer 116. The layer 118 should preferably be of the same thickness as that thickness of the layer 116 of metal to prevent the molten metal layer from penetrating the layer 118 in one or more locations prior to the remainder of the molten layer. This prevents the possibility of having faulty devices resulting from the process. Since the thickness of the layer 118 is most usually small, in the order of up to 50 or 60 microns, orientation of the crystallographic structure of the layer 118 is not critical. In this example, the layer 118 is said to be of polycrystalline silicon.

With reference to FIG. 9, the body 110, as processed, is placed in a suitable thermal gradient zone melting process apparatus as previously described, the layer 116 of aluminum becomes molten and forms a melt of aluminum-rich silicon with silicon of the surface 112 of the body 110 and the immediately adjacent silicon of the layer 118. As the thermal gradient zone melting process proceeds, a region 120 of recrystallized silicon of the layer 118 containing solid solubility of aluminum therein is produced having the same crystal structure orientation as that of the body 110. The impurity concentration of the region 120 is approximately $2 \times 10^{19}$. A P-N junction 122 is formed by the contiguous surfaces of the region 120 and the body 110 of P-type and N-type conductivity respectively. The excess molten aluminum which has migrated through the layer 118 appears on the surface 126 of the completed device 124 and is solidified thereon. The excess layer of aluminum is removed by suitable means such, for example, as by selective etching and grinding.

Although the teachings of this invention has been directed toward the making of large area power diodes, other applications of the invention are feasible. For example, referring again to FIG. 5 the recrystallized region 30 may be P$^+$-type conductivity aluminum-doped silicon formed by the thermal gradient zone melting process on a body 18 of P-type silicon. In a like manner a recrystallized region 30 of N$^+$-type conductivity is formed on a body 18 of N-type conductivity.

Referring now to FIG. 10, a semiconductor device 210 comprises three regions 212, 214 and 216 of semiconductor materials having different resistivities and the same or different type conductivity. For example, the region 212 may comprise N-type conductivity silicon, the region 214 N$^+$-type conductivity silicon and the region 216 P$^+$-type conductivity silicon. The interface 218 between the regions 214 and 216 is a P-N junction formed by the contiguous surfaces of the regions 214 and 216 of opposite type conductivity. The regions 214 and 216 are each formed from recrystallized bodies of semiconductor material of <111> crystallographic orientation like the body 10, and processed in the same or similar manner as the body 10, to form the respective regions. Similarly, the device 210 may be of the configurations N-P$^+$-N$^+$, P-P$^+$-N$^+$ and P-N$^+$-P$^+$.

Similarly, the device 210 may be of a configuration wherein the regions 214 is of N-type conductivity and each of the regions 216 and 212 are recrystallized bodies of semiconductor materials of P$^+$-type conductivity and initially of <111> crystallographic structure. P-N junctions are formed by the interface 218 and 220 of the respective pairs of the regions 214 and 216 and 214 and 212 of opposite type conductivity. The regions 212 and 216 are formed by the thermal gradient zone melting process of this invention and the regions 212 and 216 are derived from bodies of semiconductor material prepared in the same manner as the body 10 as hereintofore described. Other configurations of the device 210 prepared in this manner are as varied as the possibilities of the conductivities of the regions 212, 214 and 216. Since each of the regions 212, 214 and 216 may each be of N-type, N$^+$-type, P-type and P$^+$-type conductivity, the device 210 can be of any of configurations that is possible by varying the conductivities of the regions 212, 214 and 216 in accordance with design requirements. These various configurations offer excellent opportunities for further processing of the device 210 into multi-region semiconductor devices such, for example, as power transistors, semiconductor controlled rectifiers, bidirectional switches, and the like. The choice of semiconductor material for the regions 212, 214 and 216 in accordance with design requirements and the process requirements of this invention.

Large area power diodes made by this process exhibit the same electrical and physical characteristics as the diodes made by the previously described process of the invention.

The invention has been described relative to practicing thermal gradient zone melting in a negative atmosphere. However, it has been discovered that when each body of semiconductor material is a thin wafer of the order of 10 mils in thickness, the thermal gradient zone melting process may be practiced in an inert gas atmosphere of hydrogen, helium, argon and the like in a furnace having a positive atmosphere.

We claim as our invention:

1. A process for making a semiconductor device comprising:
   a. selecting a first body of semiconductor material having two major opposed surfaces being respectively the top and bottom surfaces thereof and a preferred crystal structure of a (111) planar orientation for at least the top surface and a <111> crystallographic axis as the vertical axis of the body;
   b. vapor depositing a layer of at least one metal of a predetermined thickness on, and in intimate contact with, the top surface of the body;
   c. placing the first body of semiconductor material on a second body of semiconductor material having two major opposed surfaces comprising respectively the top and bottom surfaces thereof wherein the layer of vapor deposited metal on the top surface of the first body is in an abutting contact relationship wih the top surface of the second body;
   d. heating the two bodies and the vapor deposited layer of metal to a predetermined elevated temperature sufficient to form a melt of metal-rich semiconductor material of the two bodies as the abutting interface of the same;
   e. establishing a temperature gradient throughout the two bodies of semiconductor material substantially aligned with the <111> axis of the first body wherein the bottom surface of the first body is at the higher temperature;
   f. migrating the melt of metal-rich semiconductor material through the first body of the semiconductor material along the <111> crystal axis from the top surface toward the bottom surface, and
   g. growing a region of recrystallized semiconductor material of the first body integral with the material of the second body from the migrating melt of metal-rich semiconductor material as it moves through the first body, the region of recrystallized material having solid solubility of the vapor deposited metal therein, the solid solubility of the metal being determined by the elevated temperature at which migration is practiced and imparting a predetermined level of resistivity and a predetermined type conductivity to the grown region, the region having the crystallographic structure of the second body.

2. The process of claim 1 wherein
   the material of the first and second bodies is one selected from the group consisting of silicon, silicon carbide, gallium arsenide and germanium.

3. The process of claim 2 wherein
   the temperature gradient is 100°C per centimeter.

4. The process of claim 2 wherein
   the second body is of N type conductivity and including
   forming a P-N junction at the interface of the second body and the recrystallized region of semiconductor material.

5. The process of claim 4 wherein
   the semiconductor material is silicon and the material of the metal layer is aluminum.

6. The process of claim 5 wherein
   the bodies of silicon have a resistivity of 10 ohm-centimeter, and
   the recrystallized region of silicon has a resistivity of approximately $8 \times 10^{-3}$ ohm-centimeters.

7. The process of claim 1 and including the further process steps of:
   h. vapor depositing a layer of at least one metal which is suitable for doping a semiconductor material to obtain a predetermined type conductivity and a predetermined level of resistivity on the top surface having a (111) planar orientation of a third body of semiconductor material having a <111> crystal axis for the vertical axis of the third body and two major opposed surfaces comprising respectively the top and bottom surfaces thereof;
   i. placing the third body of semiconductor material on one of the first and second bodies of semiconductor material wherein the layer of metal disposed on the top surface of the third surface is in an abutting contact relationship with that major surface of one of the other two bodies not joined together to the other of the two bodies by the grown recrystallized material region;
   j. heating all the bodies and the metal layer deposited on the third body to a predetermined elevated temperature to form a melt of metal-rich semiconductor material of the abutting bodies at the interface of the third body and the one of the first and second bodies;
   k. establishing a temperature gradient vertically throughout the three bodies of semiconductor material substantially aligned with the <111> axis of the third body wherein the bottom surface of the third body is at the higher temperature;
   l. migrating the molten metal-rich material through the third body of semiconductor material along the <111> axis from the top surface thereof toward the bottom surface;

m. growing a region of recrystallized semiconductor material of the third body integral with the material of the first or second bodies upon which the third body was disposed from the migrating melt of metal-rich semiconductor material as it moves through the third body, the region of recrystallized material is formed having solid solubility of the vapor deposited metal therein, the solid solubility of the metal being determined by the elevated temperature at which migration is practiced and imparting a predetermined level of resistivity and a predetermined type conductivity to the grown region, the region having the crystallographic structure of the body with which it has become integral.

8. A process for making a semiconductor diode comprising
   a. vapor depositing a layer of at least one metal suitable for doping a semiconductor material to obtain a predetermined type conductivity and a predetermined level of resistivity on the top surface of a body of semiconductor material having two major opposed surfaces comprising respectively the top and bottom surfaces thereof;
   b. depositing a layer of a semiconductor material on the layer of metal;
   c. heating the body, the metal and the semiconductor material to a predetermined elevated temperature sufficient to form a melt of metal-rich semiconductor material of the body and the layer at the abutting interface of the same;
   d. establishing a thermal gradient vertically through the body and the layers of metal and semiconductor material wherein the bottom surface of the body is at the lower temperature; and
   e. migrating the melt upward through the layer of semiconductor material to grow a recrystallized region of semiconductor material integral with the material of the body and having solid solubility of the metal therein to impart the predetermined type conductivity and the predetermined level of resistivity thereto.

9. The process of claim 8 wherein
the body is silicon of N-type conductivity,
the layer of metal is aluminum, and
the layer of semiconductor material is silicon.

* * * * *